(12) United States Patent
Yoshida et al.

(10) Patent No.: US 9,455,480 B2
(45) Date of Patent: Sep. 27, 2016

(54) ASSEMBLED BATTERY

(71) Applicant: DENSO CORPORATION, Kariya, Aichi-pref. (JP)

(72) Inventors: Shuhei Yoshida, Tokoname (JP); Daisuke Shibata, Tokai (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 164 days.

(21) Appl. No.: 14/451,767

(22) Filed: Aug. 5, 2014

(65) Prior Publication Data
US 2015/0042289 A1    Feb. 12, 2015

(30) Foreign Application Priority Data

Aug. 6, 2013    (JP) ................. 2013-163381

(51) Int. Cl.
*H02J 7/00*    (2006.01)
*H01M 10/44*    (2006.01)
(Continued)

(52) U.S. Cl.
CPC ......... *H01M 10/441* (2013.01); *H01M 10/482* (2013.01); *H02J 7/008* (2013.01); *H02J 7/0016* (2013.01); *H02J 7/0073* (2013.01); *G01R 31/362* (2013.01); *H01M 4/505* (2013.01); *H01M 4/5825* (2013.01); *H01M 10/0525* (2013.01); *H01M 2010/4271* (2013.01); *H01M 2220/20* (2013.01); *Y02E 60/122* (2013.01); *Y02T 10/7011* (2013.01); *Y02T 10/7055* (2013.01)

(58) Field of Classification Search
CPC ............. H02J 7/0021; H02J 2007/005; H02J 2007/0095; H02J 3/14

USPC ......................... 320/125, 132, 135
See application file for complete search history.

(56) References Cited

U.S. PATENT DOCUMENTS

2002/0105303 A1* 8/2002 Kishi .................... H02J 7/0047
320/134
2011/0012604 A1    1/2011 Tsujiko et al.
(Continued)

FOREIGN PATENT DOCUMENTS

JP    11-346444    12/1999
JP    2001-033532    2/2001
(Continued)

OTHER PUBLICATIONS

Office Action mailed Jun. 16, 2015 in corresponding JP application No. 2013-163381 with English translation.

*Primary Examiner* — Nghia Doan
(74) *Attorney, Agent, or Firm* — Harness, Dickey & Pierce, P.L.C.

(57) ABSTRACT

An assembled battery includes a plurality of secondary cells, a first arithmetic operator, a second arithmetic operator, and a discharger. The first arithmetic operator calculates a voltage change rate of each of the secondary cells during charging/discharging thereof. The second arithmetic operator determines a discharge condition for each of the secondary cells from the voltage change rate calculated in the first arithmetic operator and a state of charge of each of the secondary cells. The discharger performs discharging of each of the secondary cells on the basis of the discharge condition when the assembled battery is neither being charged nor being discharged. The second arithmetic operator determines the discharge condition of each of the secondary cells such that each of the secondary cells after the discharging has the same state of charge.

8 Claims, 7 Drawing Sheets

(51) Int. Cl.
*H01M 10/48* (2006.01)
*G01R 31/36* (2006.01)
*H01M 10/0525* (2010.01)
*H01M 4/505* (2010.01)
*H01M 4/58* (2010.01)
*H01M 10/42* (2006.01)

(56) References Cited

U.S. PATENT DOCUMENTS

2011/0309798 A1  12/2011  Hara et al.
2012/0166116 A1*  6/2012  Yoshida ............. G01R 31/3624
                                                    702/63
2012/0176092 A1*  7/2012  Fujii .................... G01R 31/361
                                                    320/134

FOREIGN PATENT DOCUMENTS

| JP | 2006-038494 | 2/2006 |
| JP | 2007-292778 | 11/2007 |
| JP | 2009-129644 | 6/2009 |
| JP | 2010-257984 | 11/2010 |
| JP | 2012-173048 | 9/2012 |
| JP | 2012-221855 | 11/2012 |

* cited by examiner

ASSEMBLED BATTERY

CROSS REFERENCE TO RELATED APPLICATION

This application is based on Japanese Patent Application No. 2013-163381 filed on Aug. 6, 2013, the disclosure of which is incorporated herein by reference.

TECHNICAL FIELD

The present disclosure relates to an assembled battery made of a combination of a plurality of secondary cells.

BACKGROUND

A hybrid vehicle (HV) or a plug-in hybrid vehicle (PHV) normally uses a combination of an engine (internal-combustion engine) and an electric power as a power source. In the plug-in hybrid vehicle, a larger number of cells (secondary cells) are mounted as an assembled battery than mounted in the hybrid vehicle.

In the PHV, as shown in FIG. 8, the assembled battery is used such that partial charging/discharging is repeated in a wide range of the state of charge (SOC) of the battery capacity of the assembled battery, that is, extremely small SOC changes occur in various SOCs.

An assembled battery is made of a combination of a plurality of secondary cells. In the assembled battery, charging and discharging are simultaneously performed in the individual secondary cells. When the charging and discharging are repeated in each of the secondary cells as a result of the charging and discharging of the assembled battery, variations occur in the amounts of charge and SOCs of the secondary cells.

When there are variations in the SOCs of the secondary cells, the assembled battery cannot exhibit inherent battery performance. Specifically, when the assembled battery is charged (fully charged) on the basis of the lowest SOC among the SOCs of the secondary cells, the secondary cells other than the secondary cell having the lowest SOC are overcharged so that the SOCs of the secondary cells exceed 100%. Conversely, when the assembled battery is charged (fully charged) on the basis of the highest SOC among the SOCs of the secondary cells, the SOCs of the secondary cells other than the secondary cell having the highest SOC do not reach 100%, so the SOC of the assembled battery does not also reach 100%. When the charging/discharging is repeated in the assembled battery in which the secondary cells have variations in the SOCs, the variations in the SOCs of the secondary cells increase, so the degradation of the battery performance of the assembled battery accelerates.

When the charging/discharging of the assembled battery is further repeated in the state where there are variations in the amounts of charge of the secondary cells, the degradation of the assembled battery is accelerated.

Thus, in the assembled battery, the SOCs of the individual secondary cells need to be equalized and the SOCs need to be sensed for this purpose.

For sensing the SOC, various methods have been proposed. For example, a method which senses the SOC on the basis of a battery voltage is described in JP 2010-257984 A.

SUMMARY

In JP 2010-257984 A, it is stated that: a positive electrode having an olivine structure is used for a positive electrode; a voltage change in the plateau range of a battery voltage is small; a carbon-based material having a phase change is used for a negative electrode; and a battery state is sensed from respective changing points in a Q-dV/dQ curve and a V-dV/dQ curve each resulting from the phase change.

However, when the sensing method of JP 2010-257984 A is employed in an assembled battery in which the charging/discharging is repeated over a wide SOC range as used in the PHV, it is difficult to measure the SOC. Specifically, in the method described in JP 2010-257984 A, a voltage change in the negative electrode is sensed. The sensing of the voltage change is based on the phase change in the negative electrode. The voltage change is small in the SOC region where partial charging/discharging is repeated and there is also a voltage change resulting from an overvoltage. Therefore, the sensing is difficult. In addition, the sensing method is applicable only to a SOC range in the vicinity of 0% (fully discharged) or 100% (fully charged). Moreover, the sensing of the SOC is difficult from the voltage change in the negative electrode.

It is an object of the present disclosure to provide an assembled battery which includes a plurality of secondary cells and in which variations in the SOCs of the secondary cells are suppressed.

The present inventors have found that, in which charging/discharging is repeated over a wide range of the battery capacity thereof, the foregoing issues can be solved by determining a discharge condition on the basis of the voltage change rate and the SOC of each of secondary cells, and performing discharging of each of the secondary cells on the basis of the discharge condition determined.

According to an aspect of the present disclosure, an assembled battery includes a plurality of secondary cells, a first arithmetic operator, a second arithmetic operator and a discharger. The first arithmetic operator calculates a voltage change rate of each of the secondary cells during charging and discharging thereof. The second arithmetic operator determines a discharge condition for each of the secondary cells on the basis of the voltage change rate calculated in the first arithmetic operator and a state of charge of each of the secondary cells. The discharger performs discharging of each of the secondary cells on the basis of the discharge condition, when the assembled battery is neither being charged nor being discharged. The second arithmetic operator determines the discharge condition such that each of the secondary cells after the discharging has the same state of charge.

For example, in the assembled battery, the discharge condition is determined on the basis of the voltage change rate and the SOC during the charging and discharging thereof. The variations in the SOCs of the secondary cells can be obtained from the voltage change rate during the charging and discharging. That is, not only in a SOC range in the vicinity of 0% (fully discharged) or 100% (fully charged), but also in the state where the charging and discharging have been repeated over a wide range of the battery capacity, it is possible to calculate variations in the SOCs of the individual secondary cells. Therefore, in the assembled battery according to the above aspect, even when the charging and discharging are repeated over a wide range of the battery capacity, the variations in the SOCs of the secondary cells can be obtained from the voltage change rates.

Further, on the basis of the voltage change rate and the SOC during the charging and discharging, the discharge condition is determined such that each of the secondary cells has the same SOC. Moreover, on the basis of the discharge condition, the discharging of each of the secondary cells is performed. As a result of performing the discharging of each of the secondary cells on the basis of the discharge condition, variations in the SOCs of the secondary cells of the assembled battery are eliminated. As a result, in the assembled battery, the variations in the SOCs of the secondary cells are eliminated and the degradation of the assembled battery resulting from the variations is suppressed.

Thus, in the assembled battery, even when partial charging and discharging are repeated over a wide SOC range, variations in the SOCs of the individual secondary cells can be obtained. By performing the discharging of each of the secondary cells, the SOC variations can be eliminated. As a result, in the assembled battery, the degradation of battery performance due to the variations in the SOCs of the constituent secondary cells is suppressed.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

As an assembled battery of an embodiment, an assembled battery using lithium ion secondary cells as secondary cells will be described as an example. However, the assembled battery of the present disclosure is not limited only to the assembled battery including the lithium ion secondary cells and is applicable to all the assembled batteries using any secondary cells in each of which a voltage change rate can be measured.

In this disclosure, discharging performed by a discharger (discharge device), that is, discharging performed on the basis of a discharge condition determined will be hereinafter also referred to as "bypass discharging" so as to be distinguished from "discharging" in the charging and discharging of the assembled battery.

Exemplary Embodiments

Hereinafter, an embodiment of the present disclosure will be described with reference to FIG. 1 to FIG. 9B.

Figure 1:
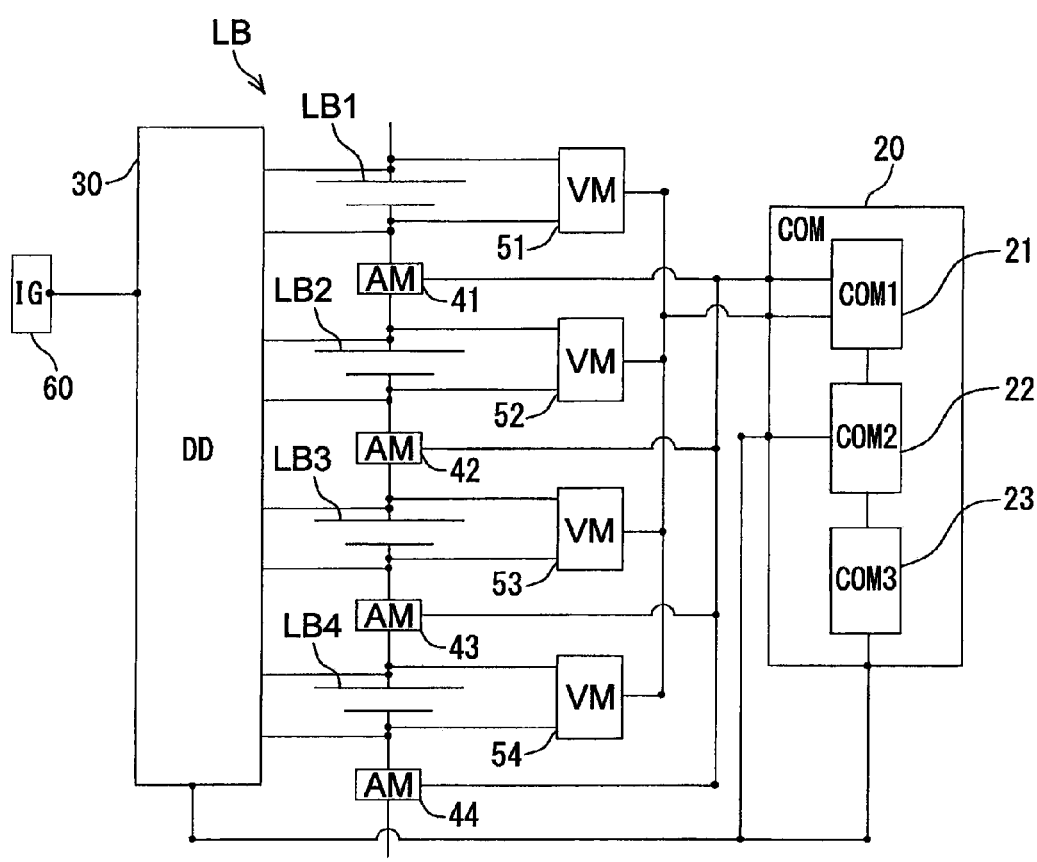
FIG. 1 is a diagram illustrating a schematic structure of an assembled battery according to an embodiment of the present disclosure.

As shown in FIG. 1, the assembled battery of the embodiment includes a plurality of lithium ion secondary cells LB, such as LB1 to LB4, an arithmetic operation device (COM) 20, and a discharge device (DD) 30. Note that, each of the lithium ion secondary cells LB1 to LB4 corresponds to a secondary cell, the arithmetic operation device 20 corresponds to an arithmetic operator, and the discharge device 30 corresponds to a discharger.

Figure 2:
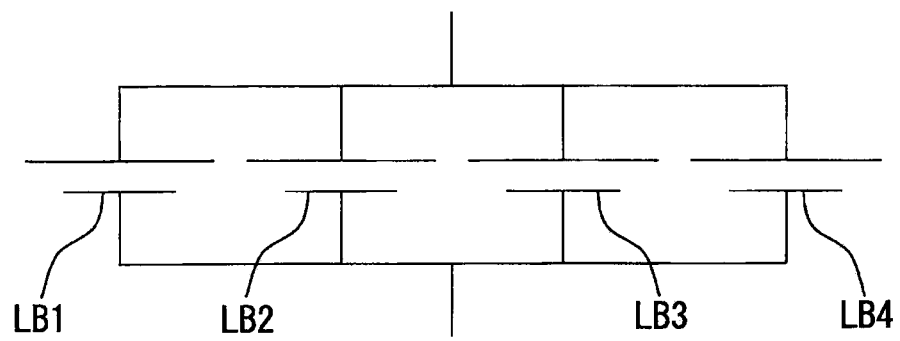
FIG. 2 is a diagram illustrating another example of connection of lithium ion cells of the assembled battery according to the embodiment.
Figure 3:
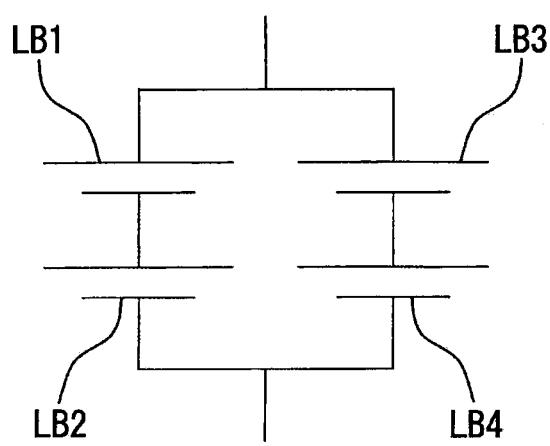
FIG. 3 is a diagram illustrating further another example of the connection of the lithium ion cells of the assembled battery according to the embodiment.

As shown in FIG. 1, in the assembled battery of the present embodiment, the plurality of lithium ion secondary cells LB1 to LB4 are connected in series. The plurality of lithium ion secondary cells LB1 to LB4 may be connected in any other way, such as being connected in parallel as shown in FIG. 2, or being connected in a series-parallel combination as shown in FIG. 3. Note that, in FIGS. 2 to 3, only the forms of the connection between the lithium ion secondary cells LB1 to LB4 are illustrated and illustrations of the other devices are omitted.

In the assembled battery of the present embodiment, the four lithium ion secondary cells LB1, LB2, LB3, and LB4 are connected in series. The number of the lithium ion secondary cells is not limited as long as it is a plural number not less than two.

In the assembled battery of the present embodiment, a specific configuration of each of the lithium ion secondary cells LB1 to LB4 of the assembled battery is not limited.

Each of the lithium ion secondary cells LB1 to LB4 preferably uses a positive electrode material having two or more plateau regions in which a potential change is small, i.e., smaller than a predetermined rate. By having the two or more plateau regions, the positive electrode material allows discrepancies among the SOCs of the individual lithium ion secondary cells LB1 to LB4 to be obtained.

Figure 4:
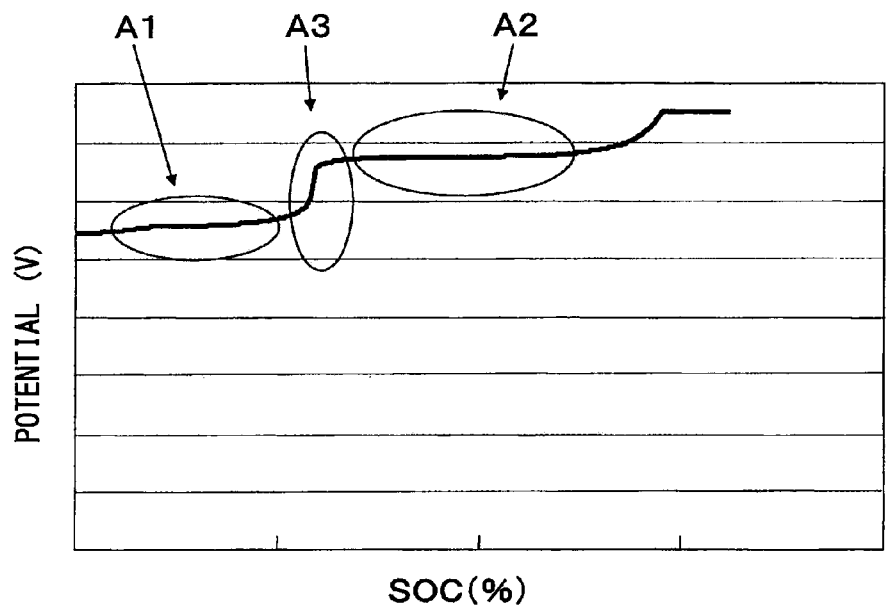
FIG. 4 is a graph showing a SOC-potential relationship of a positive electrode of each of lithium ion secondary cells using a positive-electrode active material having two plateau regions.
Figure 5:
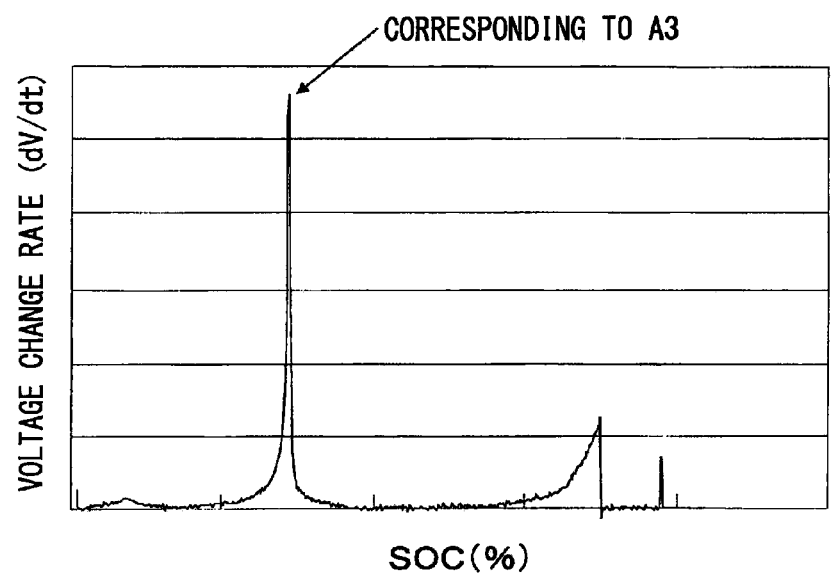
FIG. 5 is a graph showing a voltage change rate of the positive electrode of the lithium ion secondary cell using the positive-electrode active material having the two plateau regions.

Specifically, when the relationship between the SOC of the positive electrode material having the two plateau regions and a potential of the positive electrode is determined, a generally stepwise graph as illustrated in FIG. 4 can be obtained. FIG. 4 shows the relationship between the SOC of the positive electrode having the two plateau regions and the potential of the positive electrode. From FIG. 4, it is appreciated that a potential curve has a third region A3 in which the potential largely changes between the first plateau region A1 and the second plateau region A2. The voltage change rate in the positive electrode of FIG. 4 can be shown as in FIG. 5. As shown in FIG. 5, it is appreciated that the voltage change rate has one peak corresponding to the third region A3.

Figure 6:
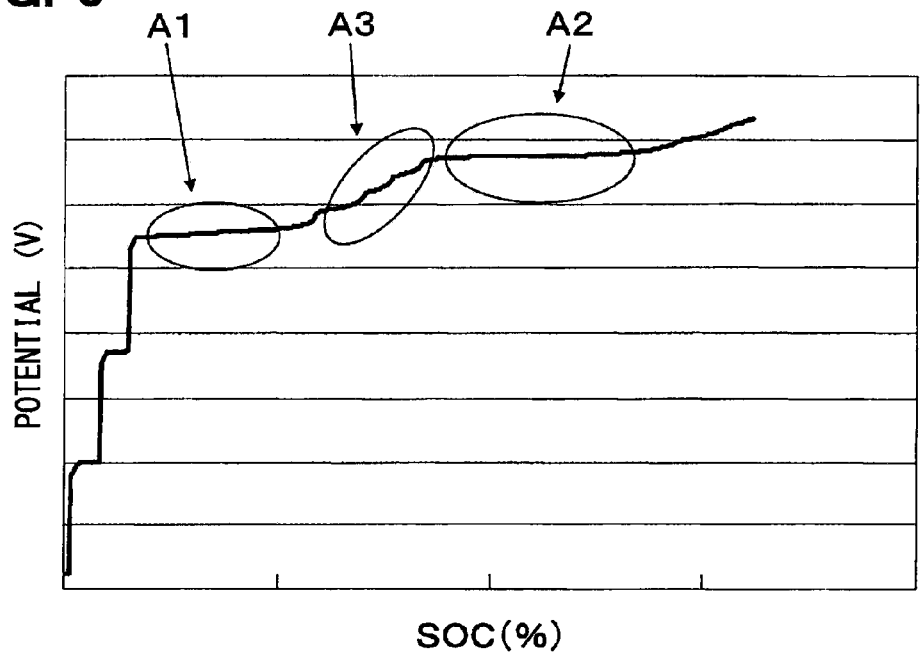
FIG. 6 is a graph showing the SOC-potential relationship of the assembled battery in which there are variations in the SOCs of the lithium ion secondary cells.

When there are variations in the SOCs of the lithium ion secondary cells of the assembled battery, in the SOC-potential relationship in the assembled battery, as shown in FIG. 6, the inclination angle of the third region A3 decreases. This results from the discrepancies observed among the positions of the third regions A3 of the respective lithium ion secondary cells. That is, when the relationship between the SOC and the voltage change rate of the assembled battery is shown as in the graph of FIG. 7, a plurality of peaks is recognized. That is, it is appreciated that the peaks corresponding to the third regions A3 are varied.

In the assembled battery of the present embodiment, variations in the SOCs of the individual lithium ion secondary cells can be obtained from the discrepancies of the positions of the peaks corresponding to the third regions A3.

In the present embodiment, it is preferable that the positive electrode material has an active material showing a two-phase coexistence type reaction. By having the active material showing the two-phase coexistence type reaction, the positive electrode material is allowed to have the two plateau regions shown in FIG. 4.

It is preferable that the active material includes an active material having an olivine-type structure. Also, it is preferable that the active material having the olivine-type structure is $Li_xMn_yM_{1-y}XO_4$, in which M is one or more transition metals, X is one or more selected from the group consisting of P, As, Si, and Mo, x satisfies a relation of $0 \leq x < 1.0$, and y satisfies a relation of $0 \leq y \leq 1.0$.

It is more preferable that the active material having the olivine-type structure is $Li_xMn_yM_{1-y}XO_4$, in which M is one or more transition metals, X is one or more selected from the group consisting of P, As, Si, and Mo, x satisfies a relation of $0 \leq x < 1.0$, and y satisfies a relation of $0.4 \leq y \leq 1.0$.

By forming the positive-electrode active material of such a compound, it is possible to obtain a lithium ion secondary cell having two plateau regions.

The assembled battery of the present embodiment includes ampere meters (AM) 41 to 44 for measuring currents flowing in the respective lithium ion secondary cells LB1 to LB4, and voltage meters (VM) 51 to 54 for measuring inter-terminal voltages of the respective lithium ion secondary cells. The ampere meters 41 to 44 and the voltage meters 51 to 54 transmit the measurement results to the arithmetic operation device 20.

The arithmetic operation device 20 includes a first arithmetic operation device (COM1) 21, a second arithmetic operation device (COM2) 22, and a third arithmetic operation device (COM3) 23. In the present embodiment, the first to third arithmetic operation devices 21 to 23 are provided as first to third arithmetic operators in the single arithmetic operation device 20. However, the first to third arithmetic operation devices 21 to 23 may also be provided as separate devices. The first to third arithmetic operation devices 21 to 23 are connected to be capable of receiving and transmitting data such as the measurement results input thereto, the calculation results, and the like. The configuration of the arithmetic operation device may not be limited to a specific one as long as a target arithmetic operation can be performed therein.

The first arithmetic operation device 21 calculates a voltage change rate of each of the lithium ion secondary cells LB1 to LB4 during the charging/discharging thereof.

The first arithmetic operation device 21 calculates, as the voltage change rate, a voltage change per unit time dV/dt on the basis of the measurement result input thereto from the voltage meter 51 to 54 and a time change. In the present embodiment, the voltage change rate is calculated as the voltage change per unit time dV/dt. However, the voltage change rate to be calculated is not limited to the voltage change per unit time dV/dt. The voltage change rate to be calculated may be a voltage change per amount of change in stored electricity dV/dQ, for example.

In the present embodiment, the first arithmetic operation device 21 further calculates an amount of charged/discharged electricity from the measurement result input thereto from the voltage meter 51 to 54 and the measurement result input thereto from the current meter 41 to 44. Then, on the basis of the calculated amount of charged/discharged electricity, the first arithmetic operation device 21 calculates a state of charge (SOC).

The second arithmetic operation device 22 determines, on the basis of voltage changes of the respective lithium ion secondary cells LB1 to LB4 during the charging and discharging thereof and the SOCs of the respective lithium ion secondary cells LB1 to LB4, which have been calculated by the first arithmetic operation device 21. The second arithmetic operation device 22 determines a discharge condition of each of the lithium ion secondary cells LB1 to LB4 such that the lithium ion secondary cells LB1 to LB4 after being discharged (bypass-discharged) have the same SOC.

Figure 7:
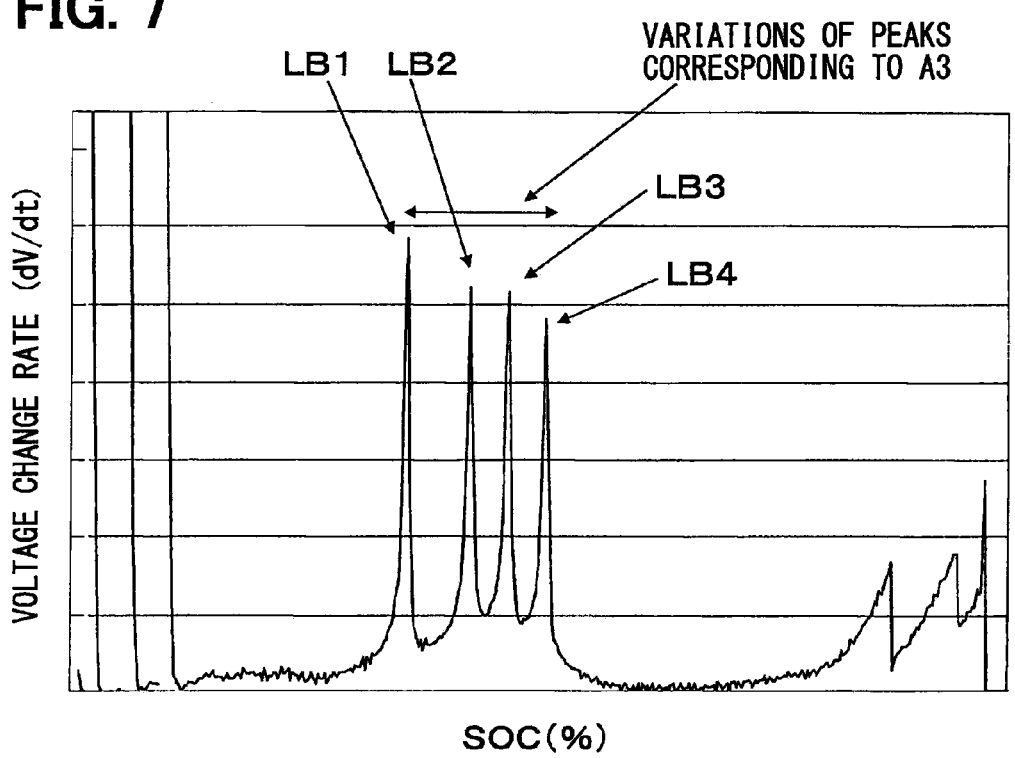
FIG. 7 is a graph showing the voltage change rate of the assembled battery in which there are variations in the SOCs of the lithium ion secondary cells.

The voltage change rate calculated in the first arithmetic operation device 21 is shown in FIG. 7. In FIG. 7, a horizontal axis represents the SOC, and a vertical axis represents the voltage change rate dV/dt. FIG. 7 is a graph showing the voltage change rates of the lithium ion secondary cells having variations in the SOCs shown in FIG. 6 mentioned above. When there are variations in the SOC values of the individual lithium ion secondary cells LB1 to LB4, the plurality of peaks are obtained as shown in FIG. 7. Note that, when there is no variation in the SOCs of all the lithium ion secondary cells LB1 to LB4 of the assembled battery, all the peaks overlap to result in the same state as shown in FIG. 5.

Hereinafter a description will be given on the assumption that, as shown in FIG. 7, the lithium ion secondary cell LB having the peak at the leftmost position (minimum SOC) is the lithium ion secondary cell LB1 and the lithium ion secondary cells LB having peaks at the progressively rightward positions are the lithium ion secondary cells LB2, LB3, and LB4.

In the present embodiment, the conditions of performing bypass discharge of the lithium ion secondary cells such that, among the lithium ion secondary cells having the different voltage change rates dV/dt, the lithium ion secondary cells LB2 to LB4, other than the lithium ion secondary cell LB1 having the minimum SOC(SOC-LB1), have the same SOC as the minimum SOC(SOC-LB1) are defined as the discharge conditions. That is, the conditions under which the bypass discharging is performed such that the peak positions overlap in FIG. 7 are referred to as the discharge conditions. The discharge conditions are specifically determined as follows.

First, the second arithmetic operation device 22 receives the voltage change rates dV/dt of the respective lithium ion secondary cells LB1 to LB4 during the charging and discharging thereof and the SOCs of the respective lithium ion secondary cells LB1 to LB4, which have been calculated in the first arithmetic operation device 21.

The second arithmetic operation device 22 compares the voltage change rates dV/dt and the SOCs input thereto to each other and determines the lithium ion secondary cell LB1 having a lowest position at which the voltage change rate dV/dt appears and the SOC(SOC-LB1) thereof.

In this case, each of the SOCs (SOC-LB2 to SOC-LB4) of the other lithium ion secondary cells LB2 to LB4 has a value larger than that of the SOC (SOC-LB1) of the determined lithium ion secondary cell LB1.

The second arithmetic operation device 22 calculates the difference ΔSOC between each of the SOCs (SOC-LB2 to SOC-LB4) of the other lithium ion cells LB2 to LB4 and the SOC(SOC-LB1) of the lithium ion secondary cell LB1 having a minimum voltage change rate is calculated.

The second arithmetic operation device 22 determines an electric energy in the amount corresponding to the obtained SOC difference ΔSOC between the lithium ion secondary cell LB1 and each of the lithium ion cells LB2 to LB4 as the discharge condition for bypass discharging of each of the lithium ion secondary cells LB2 to LB4.

More specifically, the SOC difference ΔSOC (ΔSOC2-1) between the SOC(SOC-LB2) of the lithium ion secondary cell LB2 and the SOC(SOC1) of the lithium ion secondary cell LB1 having the minimum voltage change rate is calculated. The condition for bypass discharging the electric energy in the amount corresponding to the calculated SOC difference ΔSOC (ΔSOC2-1) is determined as the discharge condition for the lithium ion secondary cell LB2.

Likewise, in each of the other lithium ion secondary cells LB3, LB4 also, the SOC difference ΔSOC (ΔSOC3-1, ΔSOC4-1) is calculated and the discharge conditions for the lithium ion secondary cells LB3, LB4 are determined.

The third arithmetic operation device 23 determines whether or not the discharge device 30 is to be permitted to perform bypass discharging. The third arithmetic operation device 23 compares the SOCs of the respective lithium ion secondary cells LB1 to LB4 to each other and calculates the difference between the maximum SOC value and the minimum SOC value. When the value of the calculated difference is larger than a threshold value determined in advance, the third arithmetic operation device 23 transmits a discharge permission (bypass discharge permission) signal to the discharge device 30.

Specifically, the third arithmetic operation device 23 compares the SOC differences ΔSOC (ΔSOC2-1, ΔSOC3-1, and ΔSOC4-1) calculated in the second arithmetic operation device 22 to each other to determine the largest value of the SOC difference ΔSOC (e.g., ΔSOC4-1). The third arithmetic operation device 23 compares the largest value of the SOC difference ΔSOC (ΔSOC4-1) to the threshold value determined in advance. When the largest value of the SOC difference ΔSOC (ΔSOC4-1) is not less than the threshold value, the third arithmetic operation device 23 transmits the bypass discharge permission signal to the discharge device 30 such that the discharge device 30 causes the bypass discharging based on the discharge conditions. When the largest value of the SOC difference ΔSOC (ΔSOC4-1) is less than the threshold value, the third arithmetic operation device 23 does not transmit the bypass discharge permission signal or transmits a bypass discharge inhibition signal.

When the assembled battery is neither being charged nor being discharged, the discharge device 30 performs the discharging (bypass discharging) of each of the lithium ion secondary cells LB2 to LB4 on the basis of the discharge conditions from the arithmetic operation device 20.

In the present embodiment, to the discharge device 30, a signal representing whether or not the assembled battery is in a charging or discharging state is further input. As the signal representing the charging state of the assembled battery, an assembled-battery-activation ON/OFF signal is used.

To the discharge device 30, the discharge conditions from the second arithmetic operation device 22 and the bypass discharge permission signal from the third arithmetic operation device 23 are input. After the bypass discharge permission signal from the third arithmetic operation device 23 is input thereto, the discharge device 30 determines whether the assembled-battery-activation signal is ON or OFF, and performs discharging of each of the lithium ion secondary cells LB1 to LB4, when the assembled-battery-activation signal is OFF.

The discharge device 30 holds the discharge conditions from the second arithmetic operation device 22 and the discharge permission signal from the third arithmetic operation device 23 in a holder (not shown), and performs the discharging when the assembled-battery-activation signal is turned OFF.

The specific configuration of the discharge device 30 is not limited as long as the discharge device 30 can cause the bypass discharging of each of the lithium ion secondary cells LB1 to LB4 on the basis of the discharge condition. The discharge device 30 may be either a single discharge device such as used in the present embodiment which causes bypass discharging for all the lithium ion secondary cells or individual discharge devices being attached in one-to-one relation to the individual lithium ion secondary cells LB1 to LB4.

The discharge device 30 may provide the electric energy, which is collected from each of the lithium ion secondary cells LB2 to LB4 by the bypass discharging, to an external device to be used therein, such as an electric circuit (not shown) outside the assembled battery.

(Operation of Assembled Battery)

An operation of the assembled battery of the present embodiment when used, for example, in a PHV will be described hereinafter.

Figure 8:
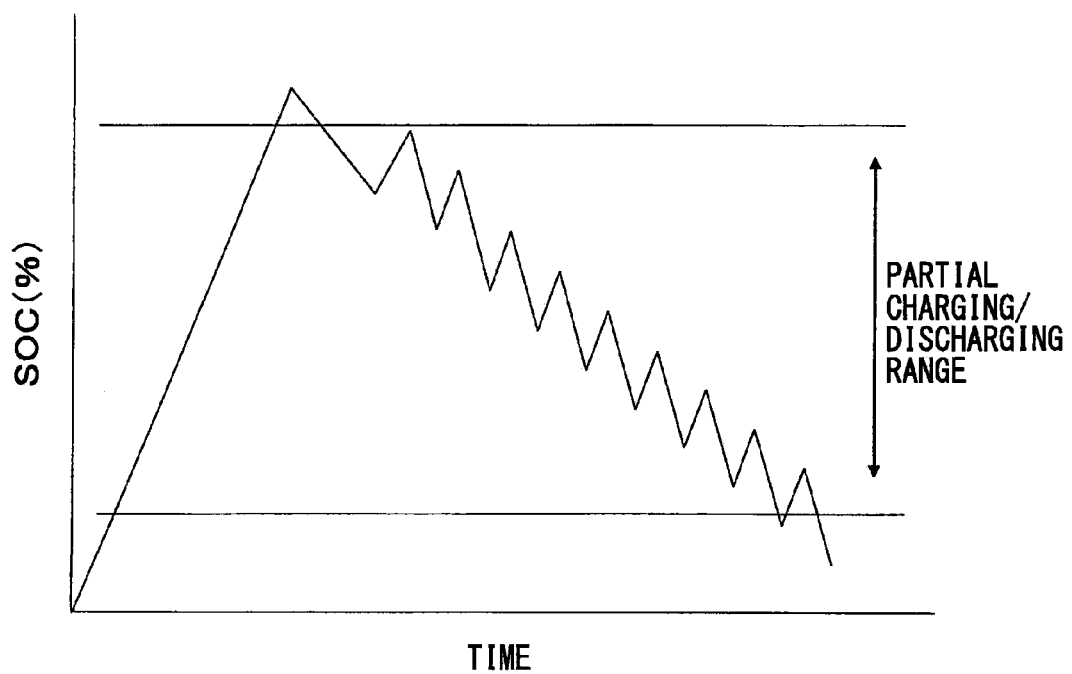
FIG. 8 is a graph showing the change of the SOC by partial charging and discharging when the assembled battery of the embodiment is used in a PHV.

In the PHV, as shown in FIG. 8, the assembled battery operates such that partial charging and discharging (an extremely small SOC change) is repeated over a wide range of the SOC of the assembled battery.

During charging/discharging, the currents flowing in the individual lithium ion secondary cells LB1 to LB4 are measured using the ampere meters 41 to 44 and the inter-terminal voltages therein are measured using the voltage meters 51 to 54. The measurement results are input to the first arithmetic operation device 21.

The first arithmetic operation device 21 calculates the voltage change per unit time dV/dt of each of the lithium ion secondary cells LB1 to LB4 as the voltage change rate based on the measurement result input thereto from the voltage meter 51 to 54 and a time change. The first arithmetic operation unit 21 also calculates the amount of charged/discharged electricity based on the measurement result input thereto from the voltage meter 51 to 54 and the measurement result input thereto from the ampere meter 41 to 44 to calculate the state of charge (SOC).

The second arithmetic operation device 22 refers to the results of calculation in the first arithmetic operation device 21 and determines the lithium ion secondary cell LB (LB1) having the minimum SOC and the other lithium ion secondary cells LB (LB2 to LB4).

The second arithmetic operator 22 calculates the SOC difference ΔSOC between the lithium ion secondary cell LB1 having the minimum SOC and each of the other lithium ion secondary cells LB2 to LB4. More specifically, the following calculation is performed.

$$(\Delta SOC\ of\ LB2; \Delta SOC2\text{-}1) = (SOC\ of\ LB2) - (SOC\ of\ LB1)$$

$$(\Delta SOC\ of\ LB3; \Delta SOC3\text{-}1) = (SOC\ of\ LB3) - (SOC\ of\ LB1)$$

$$(\Delta SOC\ of\ LB4; \Delta SOC4\text{-}1) = (SOC\ of\ LB4) - (SOC\ of\ LB1)$$

The second arithmetic operation device 22 determines the electric energy corresponding to the calculated ΔSOC of each of the lithium ion secondary cells LB2 to LB4 as the discharge condition for the corresponding lithium ion secondary cell.

The calculation results from the first arithmetic operation device 21 and the second arithmetic operation device 22 are input to the third arithmetic operation device 23.

The third arithmetic operation device 23 calculates the SOC difference ΔSOC (ΔSOC4-1) between the minimum SOC of the lithium ion secondary cell LB1 and the maximum SOC of the lithium cell secondary cell LB4.

The calculated SOC difference ΔSOC (ΔSOC4-1) is compared to the threshold value. When the SOC difference ΔSOC (ΔSOC4-1) is larger than the threshold value, the bypass discharge permission signal is transmitted to the discharge device 30. When the SOC difference ΔSOC (ΔSOC4-1) is smaller than the threshold value, the bypass discharge permission signal is not transmitted. Note that the threshold value may be either determined in advance or calculated in each case.

To the discharge device 30, the discharge conditions determined in the second arithmetic operation device 22, the bypass discharge permission signal from the third arithmetic operation device 23, and an ON/OFF signal of an ignition switch (IG) 60 of the PHV are input. The ignition switch 60 corresponds to the assembled-battery activation switch mentioned above.

When the ignition switch 60 is OFF, the discharge device 30 performs the bypass discharging of each of the lithium ion secondary cells LB2 to LB4 on the basis of each of the discharge conditions therefor. When the ignition switch 60 is ON, the discharge device 30 does not perform the bypass discharging of each of the lithium ion secondary cells LB2 to LB4.

Figure 9A:
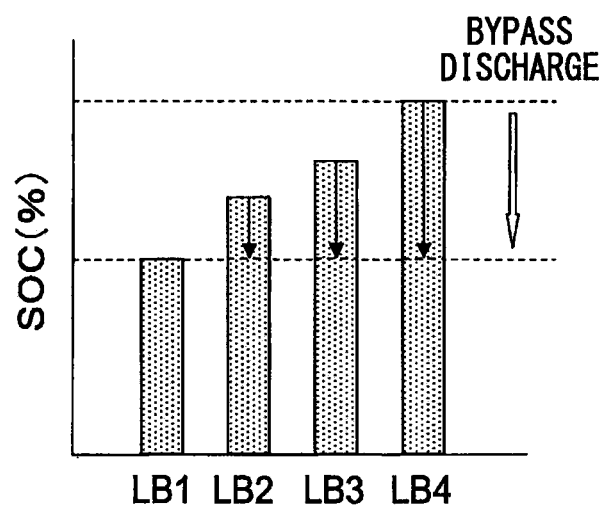
FIG. 9A is a graph showing the SOCs before bypass discharging of the lithium ion secondary cells of the assemble battery of the embodiment.
Figure 9B:
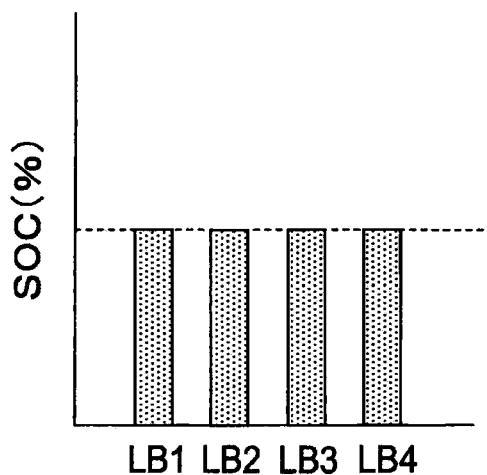
FIG. 9B is a graph showing the SOCs after the bypass discharging of the lithium ion secondary cells of the assembled battery of the embodiment.

As a result of the bypass discharging of each of the lithium ion secondary cells LB2 to LB4 by the discharge device 30, the four lithium ion secondary cells LB1 to LB4 after the bypass discharging have the same SOC values. Specifically, each of the lithium ion secondary cells LB2 to LB4 is bypass-discharged, as shown in FIG. 9A and FIG. 9B. FIG. 9A shows the SOCs of the lithium ion secondary cells LB1 to LB4 before the bypass discharging. FIG. 9B shows the SOCs of the lithium ion secondary cells LB1 to LB4 after the bypass discharging.

Thus, the four lithium ion secondary cells LB1 to LB4 have the same SOC values. That is, the other lithium ion secondary cells LB2 to LB4 have the SOC values same as that of the lithium ion secondary cell LB1.

In the assembled battery of the present embodiment, by performing the bypass discharging, variations in the SOCs thereof can be eliminated. As a result, it is possible to suppress the degradation of the performance of the entire assembled battery.

In the conventional assembled battery, the SOCs of the lithium ion secondary cells LB1 to LB4 can be measured only in a SOC range in the vicinity of 0% (fully discharged) or 100% (fully charged). However, in the present embodiment, even when partial charging/discharging is repeated in a wide range of the SOC of the assembled battery illustrated in FIG. 8, variations in the SOCs of the lithium ion secondary cells LB1 to LB4 can be detected. As a result, it is possible to eliminate variations in the SOCs of the lithium ion secondary cells LB1 to LB4 in a wide range of the SOC.

[First Modification]

The embodiment described above may be modified in the following manner. As a first modification, the following modification is the same as the embodiment described above except that the mode of bypass discharging is different.

In the embodiment described above, among the four lithium ion secondary cells LB1 to LB4 of the assembled battery, the discharge conditions of the lithium ion secondary cells LB2 to LB4 are determined so that the lithium ion secondary cells LB2 to LB4 have the same SOC as the lithium ion secondary cell LB1 having the minimum SOC (SOC-LB1). In the first modification, the discharge conditions of the lithium ion secondary cells LB1 to LB4 are determined so that the lithium ion secondary cells LB1 to LB4 have the same SOC value (SOC-LB) that is smaller than the minimum SOC value (SOC-LB1) of the lithium ion secondary cell LB1.

Specifically, in the same manner as in the embodiment described above, the first arithmetic operation device 21 calculates the voltage changes per unit time dV/dt and the SOCs of each of the lithium ion secondary cells LB1 to LB4. Then, the second arithmetic operation device 22 determines the minimum SOC (SOC-LB1) among the SOCs of the lithium ion secondary cells LB1 to LB4.

Next, the second arithmetic operation device 22 determines a SOC smaller than the minimum SOC(SOC-LB1) determined among the SOCs of the lithium ion secondary cells as a reference SOC(SOC-REF). Note that the reference SOC(SOC-REF) is preferably a value (0<<SOC-REF<SOC-LB1) slightly smaller than the minimum SOC (SOC-LB1) among the SOCs of the lithium ion secondary cells LB1 to LB4.

The second arithmetic operator 22 calculates the SOC difference ΔSOC between the reference SOC(SOC-REF) and the SOC of each of the lithium ion secondary cells LB1 to LB4 and determines the electric energy corresponding to the calculated SOC difference ΔSOC as a discharge condition for each of the cells LB1 to LB4.

Then, the discharge device 30 is caused to perform bypass discharging based on the determined discharge condition for each of the lithium ion secondary cells LB1 to LB4.

Figure 10A:
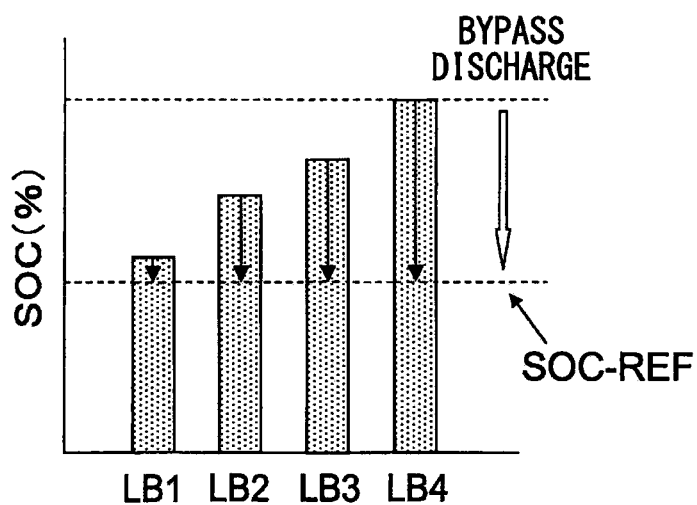
FIG. 10A is a graph showing the SOCs before the bypass discharging of lithium ion secondary cells of an assembled battery according to a modified embodiment of the present disclosure.
Figure 10B:
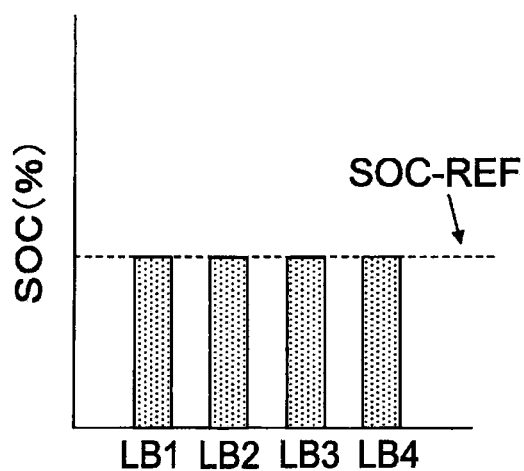
FIG. 10B is a graph showing the SOCs after the bypass discharging of the lithium ion secondary cells of the assembled battery according to the modified embodiment of the present disclosure.

In the first modification, as shown in FIG. 10A and FIG. 10B, the SOC of each of the lithium ion secondary cells LB1 to LB4 after the bypass discharging has the same value as that of the reference SOC(SOC-REF). FIG. 10A shows the SOCs of the lithium ion secondary cells LB1 to LB4 before the bypass discharging. FIG. 10B shows the SOCs of the lithium ion secondary cells LB1 to LB4 after the bypass discharging.

That is, the assembled battery in the first modification can also achieve the same effects as achieved by the assembled battery in the embodiment described above.

[Other Modifications]

By transmitting the result from the arithmetic operation device 20 to another arithmetic operation device (not shown), the result can be used to diagnose a failure in each of the lithium ion secondary cells LB1 to LB4 and the assembled battery.

[Lithium Ion Secondary Cell]

Each of the lithium ion secondary cells as the secondary cells of the assembled battery of the present disclosure may be configured to be same as a conventional lithium ion secondary cell except that the secondary cell preferably uses the positive-electrode active material described above. That is, the lithium ion secondary cell has a positive electrode, a negative electrode, an electrolyte, and the other necessary members.

The positive electrode can be produced by causing the positive-electrode active material, a conductive material, and a binding material to be suspended and mixed in a proper solvent to provide a paste, applying the paste to one surface or both surfaces of a power collector, and drying the paste.

The positive-electrode active material is not limited to the positive-electrode active material described above and a conventionally known positive-electrode active material may also be mixed therein. As the conventionally known positive-electrode active material, various oxides, sulfides, lithium-containing oxides, conductive polymers, and the like can be used. Specific examples thereof include $MnO_2$, $TiS_2$, $TiS_3$, $MoS_3$, $FeS_2$, $LiFePO_4$, $Li_{1-z}MnO_2$, $Li_{1-z}Mn_2O_4$, $Li_{1-z}CoO_2$, $Li_{1-z}NiO_2$, $LiV_2O_3$, $V_2O_5$, polyaniline, polyparaphenylene, polyphenylene sulfide, polyphenylene oxide, polythiophene, polypyrrole, derivatives thereof, and a stable radical compound. In such a positive-electrode active material, z represents a number of 0 to 1. A material made by the addition of, or substitution by, Li, Mg, Al or a transition metal such as Co, Ti, Nb, or Cr or the like may also be used. Such a lithium-metal composite oxide can be used not only alone. It is also possible to mix a plurality of types of such lithium-metal composite oxides and use the mixture.

As the conductive material and the binding material, a conventionally known conductive material and a conventionally known binding material can be used. Examples of the binding material include PVDF, EPDM, SBR, NBR, fluorine-containing rubber, and the like. Examples of the conductive material include graphite fine particles, acetylene black, Ketjen Black, carbon black such as carbon nanofiber, fine particles of amorphous carbon such as needle coke, and the like.

As the solvent in which the positive-electrode active material and the like are dispersed, an organic solvent in which the binding material is dissolved is normally used. Examples of such an organic solvent include NMP, dimethylformamide, dimethylacetamide, methyl ethyl ketone, cyclohexane, methyl acetate, methyl acrylate, diethyl triamine, N,N-dimethylaminopropylamine, ethylene oxide, tetrahydrofuran, and the like. However, the organic solvent is not limited thereto. It may also be possible to add a dispersant, a thickener, or the like to water and make the active material into a paste using PTFE or the like.

Examples of the power collector of the positive electrode include a worked metal such as aluminum or stainless steel, a foil worked into a plate shape, a net, a punched metal, a foam metal, and the like.

The negative material can have the same configuration as that of a conventionally known negative electrode.

The negative electrode is produced by causing a negative electrode composite material including a negative-electrode active material, a conductive material, and a binding material to be suspended and mixed in an appropriate solvent to provide a paste, applying the paste to one surface or both surfaces of the power collector, and drying the paste.

As the negative-electrode active material, a conventionally known negative-electrode active material for a non-aqueous electrolyte battery can be used. For the negative electrode, a negative-electrode active material containing at least one element selected from the group consisting of Sn, Si, Sb, Ge, and C can be used. Among such negative-electrode active materials, C is preferably a carbon material capable to absorbing/desorbing electrolytic ions in the lithium ion secondary cells (having a Li storage capacity) and is more preferably amorphous coated natural graphite.

Among such negative-electrode active materials, Sn, Sb, and Ge are alloy materials showing particularly large volume changes. Such a negative-electrode active material may also form an alloy with another metal such as a Ti—Si alloy, an Ag—Sn alloy, a Sn—Sb alloy, an Ag—Ge alloy, a Cu—Sn alloy, or a Ni—Sn alloy.

As the conductive material, a carbon material, metal powder, a conductive polymer, or the like can be used. In terms of conductivity and stability, a carbon material such as acetylene black, Ketjen Black, or carbon black is used preferably.

Examples of the binding material include polytetrafluoroethylene (PTFE), polyvinylidene fluoride (PVDF), a fluorine-containing resin copolymer (ethylene tetrafluoride-propylene hexafluoride copolymer) (SBR), an acrylic rubber, a fluoric rubber, polyvinyl alcohol (PVA), a styrene-maleic acid resin, polyacrylate, carboxylmethylcellulose (CMC), and the like.

Examples of the solvent include an organic solvent such as N-methyl-2-pyrrolidone (NMP), water, and the like.

As the power collector, a conventionally known power collector can be used and a foil, mesh, or the like made of copper, stainless steel, titanium, or nickel can be used.

The type of the electrolyte is not particularly limited. The electrolyte is preferably at least one of an inorganic salt selected from the group consisting of $LiPF_6$, $LiBF_4$, $LiClO_4$, and $LiAsF_6$, a derivative of such an inorganic salt, an organic salt selected from the group consisting of $LiSO_3CF_3$, $LiC(SO_3CF_3)_3$, $LiN(SO_2CF_3)_2$, $LiN(SO_2C_2F_5)_2$, $LiN(SO_2CF_3)(SO_2C_4F_9)$, and a derivative of such an organic salt. Such an electrolyte allows the battery performance to be further improved and allows the battery performance to be maintained higher even in a temperature range other than a room temperature. The concentration of the electrolyte is also not particularly limited. Preferably, the concentration of the electrolyte is selected appropriately depending on the use thereof and in consideration of the types of the electrolyte and the organic solvent.

The organic solvent in which the electrolyte is dissolved is not particularly limited as long as the organic solvent is normally used in the electrolytic solution of a lithium ion secondary cell. Examples of such an organic solvent include carbonates, halogenated hydrocarbon, ethers, ketones, nitriles, lactones, an oxolane compound, and the like. In particular, propylene carbonate, ethylene carbonate, 1,2-dimethoxyethane, dimethyl carbonate, diethyl carbonate, ethyl methyl carbonate, vinylene carbonate, or the like and a solvent mixture thereof are appropriate. Among the organic solvents shown by way of example, one or more non-aqueous solvents selected particularly from the group consisting of carbonates, ethers, and the like is used preferably because such a non-aqueous solvent has an excellent electrolyte solubility, an excellent dielectric constant, and an excellent viscosity and provides the battery with high charge/discharge efficiency.

The positive electrode and the negative electrode are provided with a separator interposed therebetween. The separator functions to electrically insulate the positive electrode and the negative electrode from each other and hold an electrolytic solution. For example, a porous synthetic resin film, particularly a porous film made of a polyolefin-based polymer (polyethylene or polypropylene) may be used appropriately. Note that, to secure the insulation between the positive electrode and the negative electrode, the separator larger in size than the positive electrode and the negative electrode is used preferably.

As necessary, each of the lithium ion secondary cells can be formed of another element in addition to the elements mentioned above. The shape of the lithium ion secondary cell is not particularly limited as long as the shape allows the lithium ion secondary cell to form the assembled battery.

The lithium ion secondary cells can be formed as cells having various shapes such as a coin shape, a cylindrical shape, and a quadrilateral shape or cells each having an irregular shape sealed in a laminate resin.

Example

Using an example, the present disclosure will be described below.

As an example of the present disclosure, the assembled battery of the embodiment described above was produced. Specifically, the following four lithium ion secondary cells were produced, and the assembled battery is made by the four lithium ion secondary cells together with the arithmetic operation device and the discharge device.

(Lithium Ion Secondary Cells)

Positive-electrode active material powder made of $LiMn_{0.5}Fe_{0.5}PO_4$, acetylene black as a conductive material, and PVDF as a binder were weighed to provide a 85:50:10 mass ratio and mixed together in an agate mortar to prepare a positive-electrode active material paste.

The prepared positive-electrode active material paste was applied to a power collector $1a$ made of an aluminum foil (15 mm square and having a thickness of 5 μm) as the power collector and dried in vacuum. Then, a positive electrode having a positive-electrode active material layer measuring 0.18 $mg/mm^2$ and 2.0 $g/cm^3$ in the surface thereof was produced.

A negative-electrode active material made of carbon particles each having a structure in which the surface of a graphite particle is coated with amorphous carbon, a conductive material made of acetylene black, a binder made of SBR, and a binder made of CMC were weighed to provide a 50:40:5:5 mass ratio and dispersed in MNP to prepare a negative-electrode active material paste.

The prepared negative-electrode active material paste was applied to a power collector made of a copper foil and dried in vacuum. Then, a negative electrode having a negative-electrode active material layer measuring 2.66 $mg/mm^2$ and 1.5 $g/cm^3$ in the surface thereof was produced.

Thus, the lithium ion secondary cells LB1 to LB4 were obtained.

The four lithium ion secondary cells LB1 to LB4 obtained were used to form the assembled battery of the embodiment described above together with the arithmetic operation device 20, the discharge device 30, and the like.

[Evaluation]

To evaluate the assembled battery of the example, extremely small charging/discharging was repeated and variations in the SOCs of the four lithium ion secondary cells LB1 to LB4 were checked.

Specifically, the assembled battery was charged at 0.5 C till the SOC reached 100% (fully charged). Then, a discharging/charging cycle including 1-minute discharging at 1.5 C and 10-second charging at 0.5 C was repeated 100 times. In the assembled battery of the example, after the completion of each cycle, the switch was turned OFF and the bypass discharging by the discharge device 30 was performed. That is, charging/discharging was repeated in a state where the threshold value of the third arithmetic operation device 23 was not set (i.e., in a state where the threshold value is zero).

After the completion of the 100 cycles, the lithium ion secondary cells LB1 to LB4 were removed, the SOC of each of the lithium ion secondary cells LB1 to LB4 was measured, and the difference between the maximum SOC and the minimum SOC was calculated.

As a comparative example, the same charging/discharging cycle as in the example was repeatedly performed without causing the discharge device 30 to perform discharging and the difference between the maximum SOC and the minimum SOC of the lithium ion secondary cells LB1 to LB4 was similarly calculated.

(Evaluation Result)

The SOC difference measured in the assembled battery of the example was 16% when the SOC difference in the assembled battery of the comparative example was 100%.

That is, it is appreciated that, in the assembled battery of the example, as a result of performing the discharging for eliminating the variations in the SOCs of the constituent lithium ion secondary cells, variations in the SOCs of the lithium ion secondary cells of the assembled battery were considerably smaller than those of the comparative example in which the discharging for eliminating the variations is not performed.

That is, in the assembled battery of the example, the degradation of the assembled battery resulting from variations in the SOCs of the constituent lithium ion secondary cells is not accelerated.

In addition, in the assembled battery of the example, even during a cycle test in which extremely small charging/discharging was repeated from the fully charged state, variations in the SOCs of the individual lithium ion secondary cells could be obtained and the SOC variations could be eliminated by causing the discharge device 30 to discharge each of the lithium ion secondary cells. That is, by using a positive-electrode active material having an olivine-type structure showing a two-phase coexistence type reaction as the positive-electrode active material in each of the lithium ion secondary cells LB1 to LB4, variations in the SOCs of the lithium ion secondary cells LB1 to LB4 could be obtained in a wide SOC range.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. An assembled battery comprising:
  a plurality of secondary cells;
  a first arithmetic operator calculating a voltage change rate of each of the secondary cells during charging and discharging thereof;
  a second arithmetic operator determining a discharge condition for each of the secondary cells from the voltage change rate calculated by the first arithmetic operator and a state of charge of each of the secondary cells; and
  a discharger performing discharging of each of the secondary cells on the basis of the discharge condition when the assembled battery is neither being charged nor being discharged, wherein
  the second arithmetic operator determines the discharge condition such that each of the secondary cells after the discharging has the same state of charge,
  the second arithmetic operator determines one of the secondary cells having a minimum value of the state of charge among the secondary cells having different voltage change rates calculated in the first arithmetic operator, and determines the discharge condition of another one of the secondary cells on the basis of the minimum value of the state of charge of the one of the secondary cells, and the second arithmetic operator calculates a difference between the state of charge of one of the secondary cells having a minimum value of the state of charge and the state of charge of another one of the secondary cells, and determines the discharge condition of the another one of the secondary cells so that the discharging of the another one of the secondary cells is performed according to the difference of the state of charge calculated.

2. The assembled battery according to claim 1, further comprising:

a third arithmetic operator calculating a difference between a maximum value and a minimum value among the states of charge of the secondary cells, wherein, when the difference between the maximum value and the minimum value of the states of charge calculated in the third arithmetic operator exceeds a threshold value, the discharger is allowed to perform the discharging of each of the secondary cells based on the discharge condition.

3. The assembled battery according to claim 1, wherein each of the secondary cells includes a positive electrode material that has two or more plateau regions in which a change in potential is smaller than a predetermined rate in a characteristic between the state of charge and the potential.

4. The assembled battery according to claim 3, wherein the positive electrode material has an active material that has a two-phase coexistence type reaction.

5. The assembled battery according to claim 4, wherein the active material has an active material having an olivine-type structure.

6. The assembled battery according to claim 5, wherein the active material having the olivine-type structure is $Li_xMn_yM_{1-y}XO_4$, in which M is one or more transition metals, X is one or more selected from the group consisting of P, As, Si, and Mo, x satisfies a relation of $0 \leq x < 1.0$, and y satisfies a relation of $0 \leq y \leq 1.0$.

7. The assembled battery according to claim 6, wherein the active material having the olivine-type structure is $Li_xMn_yM_{1-y}XO_4$, in which M is one or more transition metals, X is one or more selected from the group consisting of P, As, Si, and Mo, x satisfies a relation of $0 \leq x < 1.0$, and y satisfies a relation of $0.4 \leq y \leq 1.0$.

8. The assembled battery according to claim 1, wherein in the discharging of the another one of the secondary cells performed by the discharger, an electric energy corresponding to the difference of the state of charge calculated is discharged.

* * * * *